United States Patent
Ishinabe

(10) Patent No.: US 10,893,629 B2
(45) Date of Patent: Jan. 12, 2021

(54) LIQUID IMMERSION TANK AND ELECTRONIC APPARATUS

(71) Applicant: FUJITSU LIMITED, Kawasaki (JP)

(72) Inventor: Minoru Ishinabe, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 43 days.

(21) Appl. No.: 16/451,933

(22) Filed: Jun. 25, 2019

(65) Prior Publication Data
US 2020/0037467 A1    Jan. 30, 2020

(30) Foreign Application Priority Data
Jul. 24, 2018  (JP) .................. 2018-138715

(51) Int. Cl.
*H05K 7/20* (2006.01)

(52) U.S. Cl.
CPC ................. *H05K 7/20236* (2013.01)

(58) Field of Classification Search
CPC ............ H05K 7/20236; H05K 7/20736; F28F 2220/00; F28F 2280/06; F28F 13/08
See application file for complete search history.

(56) References Cited

U.S. PATENT DOCUMENTS

| | | | |
|---|---|---|---|
| 2017/0265328 A1* | 9/2017 | Sasaki | H05K 7/20781 |
| 2017/0265336 A1* | 9/2017 | Ichinose | G06F 1/20 |
| 2017/0303443 A1* | 10/2017 | Inano | G06F 1/206 |

FOREIGN PATENT DOCUMENTS

| | | | | |
|---|---|---|---|---|
| JP | 2014-040970 | 6/2014 | | |
| JP | 2017-163065 | 9/2017 | | |
| WO | WO-2018087903 A1 * | 5/2018 | | H05K 7/14 |
| WO | WO-2018207305 A1 * | 11/2018 | | H05K 7/20763 |

* cited by examiner

*Primary Examiner* — Devon Russell
(74) *Attorney, Agent, or Firm* — Staas & Halsey LLP

(57) ABSTRACT

A liquid immersion tank includes a first tank configured to store coolant to cool an electronic device provided in the first tank, a first plate horizontally disposed below the electronic device and configured to include straightening holes that penetrate through the first plate in a vertical-direction, and a second plate disposed below the first plate and configured to be movable from an overlap position overlapped by the first plate to a spaced position where the second plate is disposed below the first plate and spaced from the first plate, the second plate including flow adjusting holes that are formed at positions respectively aligned with the straightening holes and that penetrate through the second plate in the vertical-direction, wherein, in a region where the first plate overlaps the second plate, a total opening area of the flow adjusting holes is smaller than a total opening area of the straightening holes.

12 Claims, 16 Drawing Sheets

LIQUID IMMERSION TANK AND ELECTRONIC APPARATUS

CROSS-REFERENCE TO RELATED APPLICATION

This application is based upon and claims the benefit of priority of the prior Japanese Patent Application No. 2018-138715, filed on Jul. 24, 2018, the entire contents of which are incorporated herein by reference.

FIELD

The embodiment discussed herein is related to a liquid immersion tank and an electronic apparatus.

BACKGROUND

Nowadays, liquid immersion tanks are started to be used. The liquid immersion tanks store coolant and receive a plurality of electronic units. The electronic units are immersed in the coolant so as to be cooled (see, for example, Japanese Laid-open Patent Publication No. 2017-163065). In many such liquid immersion tanks, slots that receive the electronic units are provided in a main tank, and a straightening plate having a plurality of straightening holes is horizontally disposed below the slot.

The main tank has a coolant inflow port through which the coolant flows into the main tank. The coolant inflow port is located below the straightening plate. In the liquid immersion tanks, the coolant having flowed into the main tank from the coolant inflow port is supplied to the electronic units through the straightening holes.

Japanese Laid-open Patent Publication No. 2014-40970 is another example of related art.

SUMMARY

According to an aspect of the embodiments, a liquid immersion tank includes a first tank configured to store coolant to cool an electronic device provided in the first tank, a first plate horizontally disposed below the electronic device and configured to include a plurality of straightening holes that penetrate through the first plate in a vertical direction, and a second plate disposed below the first plate and configured to be movable from an overlap position overlapped by the first plate to a spaced position where the second plate is disposed below the first plate and spaced from the first plate, the second plate including a plurality of flow adjusting holes that are formed at positions respectively aligned with the plurality of straightening holes and that penetrate through the second plate in the vertical direction, wherein, in a region where the first plate overlaps the second plate, a total opening area of the plurality of flow adjusting holes is smaller than a total opening area of the plurality of straightening holes.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

When the forms of the plurality of electronic units are different from one another, for example, when the packing density varies among the electronic units, it is thought that the flow amount of the coolant supplied to the electronic units varies. For example, since the coolant is unlikely to flow to a high-packing density electronic unit which generates a large amount of heat and with which a large amount of pressure is lost, there is a possibility that the flow amount of the coolant flowing to the high-packing density electronic unit is relatively smaller than that of the coolant flowing to a low-packing density electronic unit which generates a small amount of heat and with which a small amount of pressure is lost.

Hereinafter, an embodiment of a technique with which the flow amount of coolant supplied to electronic units may be adjusted in accordance with the electronic units is described.

Figure 1:
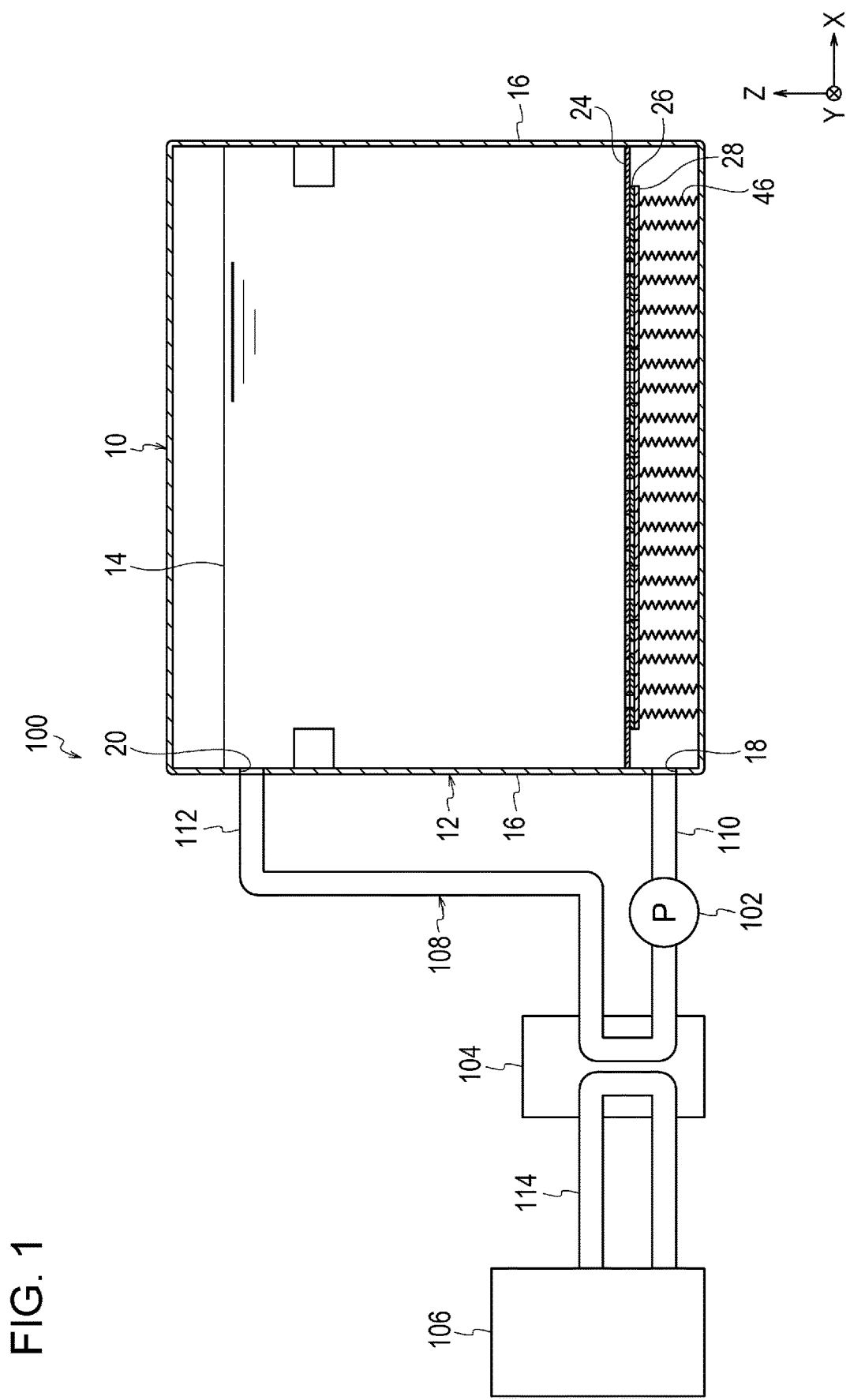
FIG. 1 illustrates a cooling system to which a liquid immersion tank according to an embodiment is applied.

FIG. 1 illustrates a cooling system 100 to which a liquid immersion tank 10 according to the present embodiment is applied. The cooling system 100 includes the liquid immersion tank 10, a circulation pump 102, a heat exchanger 104, and a chiller 106.

The liquid immersion tank 10 includes a box-shaped main tank 12 in which a coolant 14 is stored. As the coolant 14 (coolant liquid), for example, a fluorinated inert liquid or oil is used as a liquid having an insulating property and exhibiting high cooling efficiency. A plurality of electronic units are received in the main tank 12 so as to be cooled when the electronic units are immersed in the coolant 14. In FIG. 1, the electronic units are not received.

The main tank 12 includes a plurality of side walls 16. A coolant inflow port 18 is formed in a lower portion of one of the side walls 16. The coolant 14 flows into the main tank 12 through the coolant inflow port 18. A coolant discharge port 20 is formed in an upper portion of the side wall 16. The coolant 14 is discharged from inside of the main tank 12 through the coolant discharge port 20. A coolant circulation circuit 108 is provided between the main tank 12 and the heat exchanger 104.

The coolant circulation circuit 108 includes an outward pipe 110 and a return pipe 112. The outward pipe 110 is connected to the coolant inflow port 18 and the return pipe 112 is connected to the coolant discharge port 20. The coolant circulation circuit 108 is thermally coupled to the heat exchanger 104. The circulation pump 102 is provided, for example, in the outward pipe 110. A chilled water circulation circuit 114 is provided between the chiller 106 and the heat exchanger 104.

In the cooling system 100, when the circulation pump 102 is operated, the coolant 14 circulates between the liquid immersion tank 10 and the heat exchanger 104 through the coolant circulation circuit 108. Furthermore, chilled water circulates between the chiller 106 and the heat exchanger 104 through the chilled water circulation circuit 114. The heat exchanger 104 cools the coolant 14 by using the chilled water. This cooled coolant 14 is supplied to the liquid immersion tank 10. In the liquid immersion tank 10, the coolant 14 flows into the main tank 12 from the coolant inflow port 18. This coolant 14 having flowed into the main tank 12 flows from a lower portion toward an upper portion of the main tank 12 and is discharged to the outside of the main tank 12 from the coolant discharge port 20.

Next, the structure of the liquid immersion tank 10 is described in detail.

Figure 2:
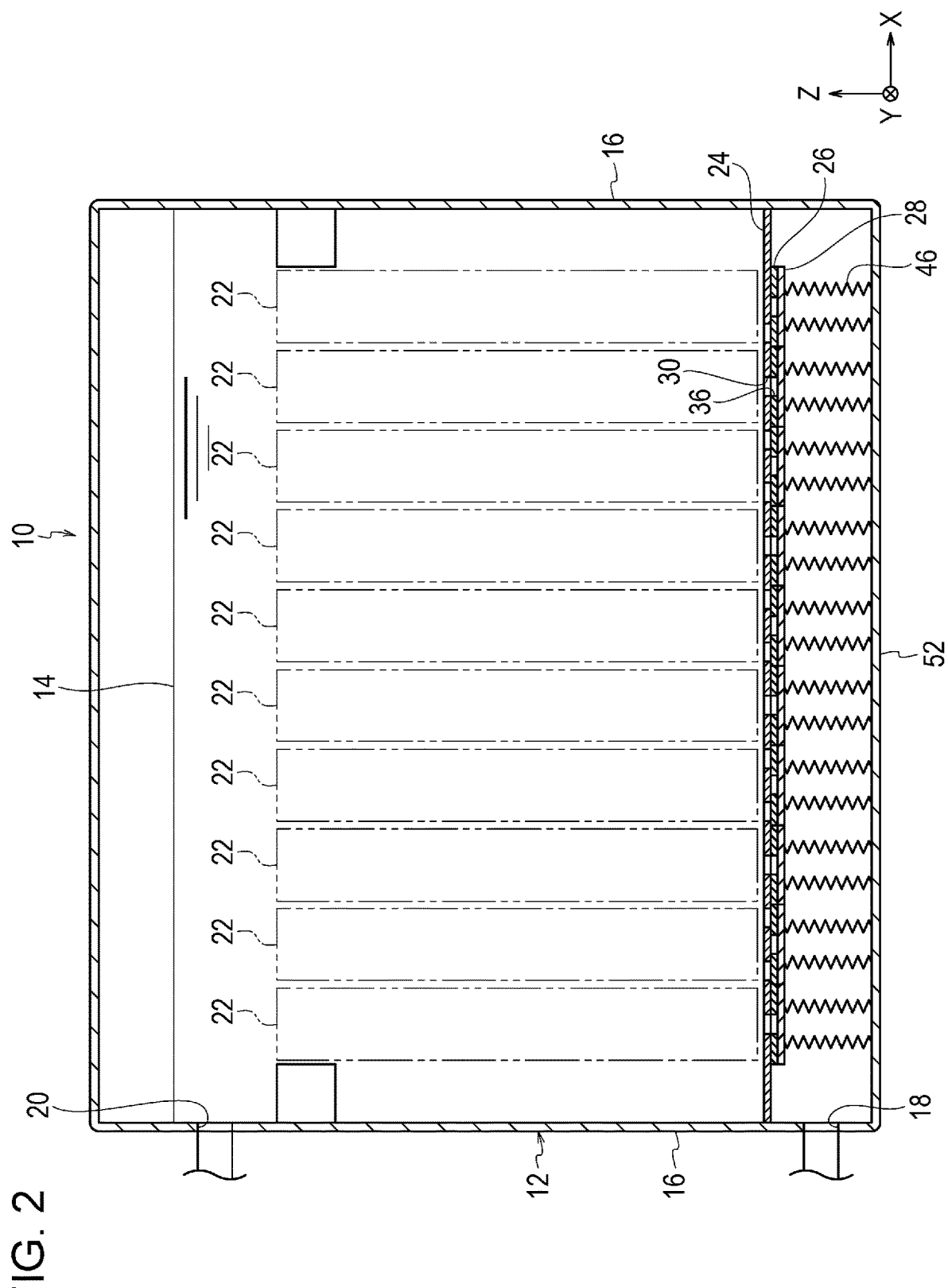
FIG. 2 is an enlarged longitudinal sectional view of the liquid immersion tank illustrated in FIG. 1.

FIG. 2 is an enlarged view of the liquid immersion tank 10 illustrated in FIG. 1. An arrow X, an arrow Y, and an arrow Z illustrated in each of the drawings respectively indicate the transverse direction, the depth direction, and the height direction of the liquid immersion tank 10. As illustrated in FIG. 2, a plurality of slots 22 are provided in the main tank 12. In FIG. 2, the slots 22 are each illustrated by a phantom line. The slots 22 are arranged in the horizontal direction. Each of the slots 22 receives a corresponding one of the electronic units. In FIG. 2, the electronic units are not received as is the case with FIG. 1. The slots 22 are each defined by, for example, a space between a pair of rails supporting respective side portions of the electronic units. The slots 22 are located below the coolant discharge port 20.

A plurality of layers of plates are provided in the main tank 12. According to the present embodiment, for example, three layers of plates, for example, a straightening plate (first plate) 24, a plurality of flow adjusting plates 26, and a plurality of open/close plates 28 are used. The straightening plate 24 is horizontally disposed below the slots 22. This straightening plate 24 is located above the coolant inflow port 18. The flow adjusting plates (second plates) 26 are disposed below the straightening plate 24, and the open/close plates (third plates) 28 are each disposed below a corresponding one of the flow adjusting plates 26.

Figure 3:
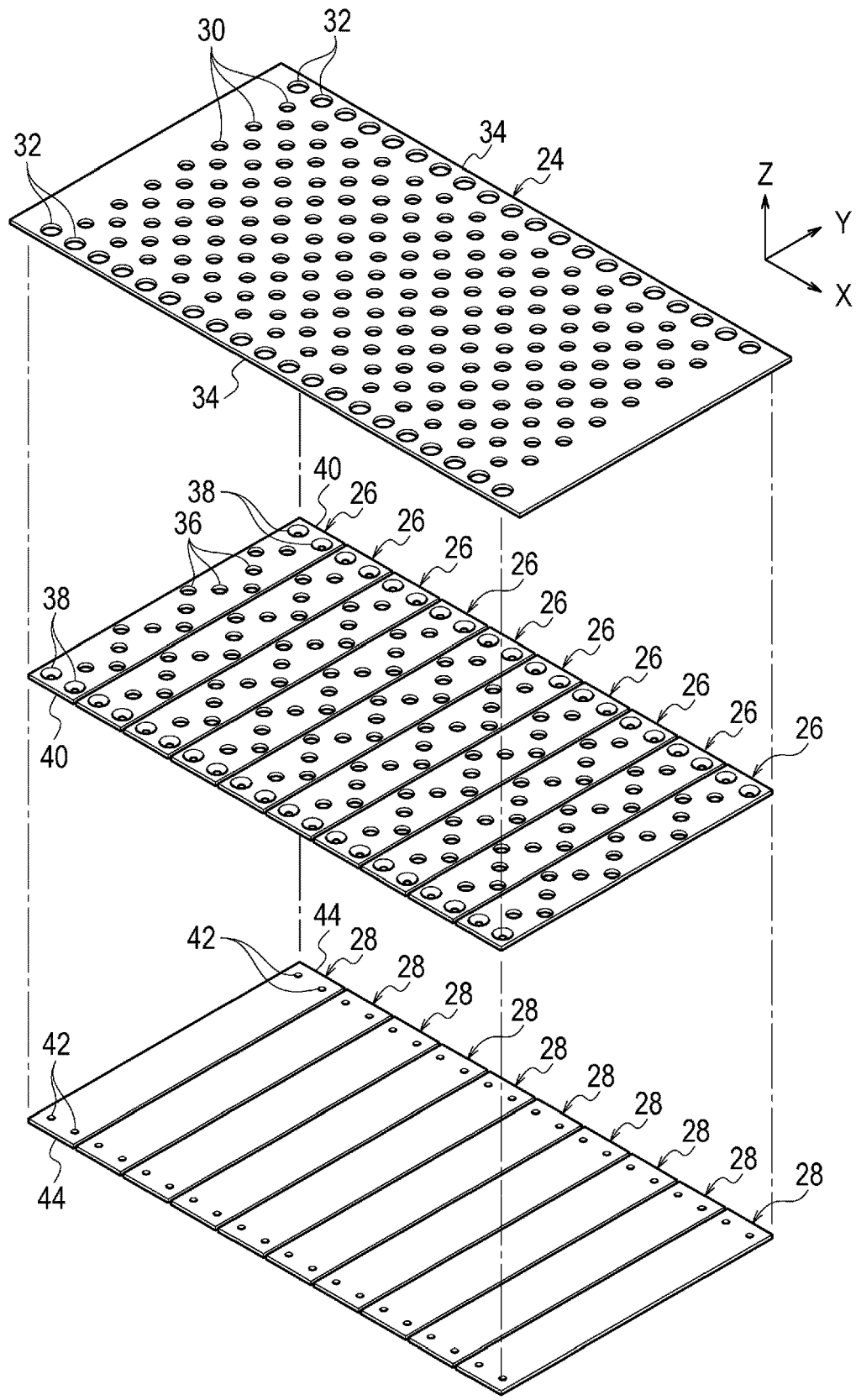
FIG. 3 is an exploded perspective view of a straightening plate, a plurality of flow adjusting plates, and a plurality of open/close plates illustrated in FIG. 2.

FIG. 3 is an exploded perspective view of the straightening plate 24, the flow adjusting plates 26, and the open/close plates 28 illustrated in FIG. 2. As illustrated in FIG. 3, the straightening plate 24 has a plurality of straightening holes 30 and a plurality of through holes 32. The straightening holes 30 and the through holes 32 penetrate through the straightening plate 24 in the up-down direction (thickness direction of the straightening plate 24). The straightening holes 30 are distributed over the entirety of the straightening plate 24. The straightening plate 24 has a rectangular shape in plan view. The through holes 32 are formed along a pair of long side portions 34 of the straightening plate 24.

Each of the flow adjusting plates 26 has a rectangular shape the longitudinal direction of which is the lateral direction of the straightening plate 24 in plan view. The flow adjusting plates 26 are arranged in the longitudinal direction of the straightening plate 24. The longitudinal direction of the straightening plate 24 serves as an example of the horizontal direction. Each of the flow adjusting plates 26 has a plurality of flow adjusting holes 36 and a plurality of first retaining holes 38. The flow adjusting holes 36 and the first retaining holes 38 penetrate through the flow adjusting plate 26 in the up-down direction (thickness direction of the flow adjusting plate 26). The flow adjusting holes 36 are distributed over the entirety of the flow adjusting plate 26. The first retaining holes 38 are formed along a pair of short side portions 40 of the flow adjusting plate 26.

The external shape of each of the open/close plates 28 is similar to that of the flow adjusting plates 26. As is the case with the flow adjusting plates 26, the open/close plates 28 are arranged in the longitudinal direction of the straightening plate 24 serving as the example of the horizontal direction. Each of the open/close plates 28 has a plurality of second retaining holes 42. Each of the second retaining holes 42 are open at the top. The second retaining holes 42 are formed along a pair of short side portions 44 of the open/close plate 28. No flow adjusting hole is formed in the open/close plate 28.

Figure 4:
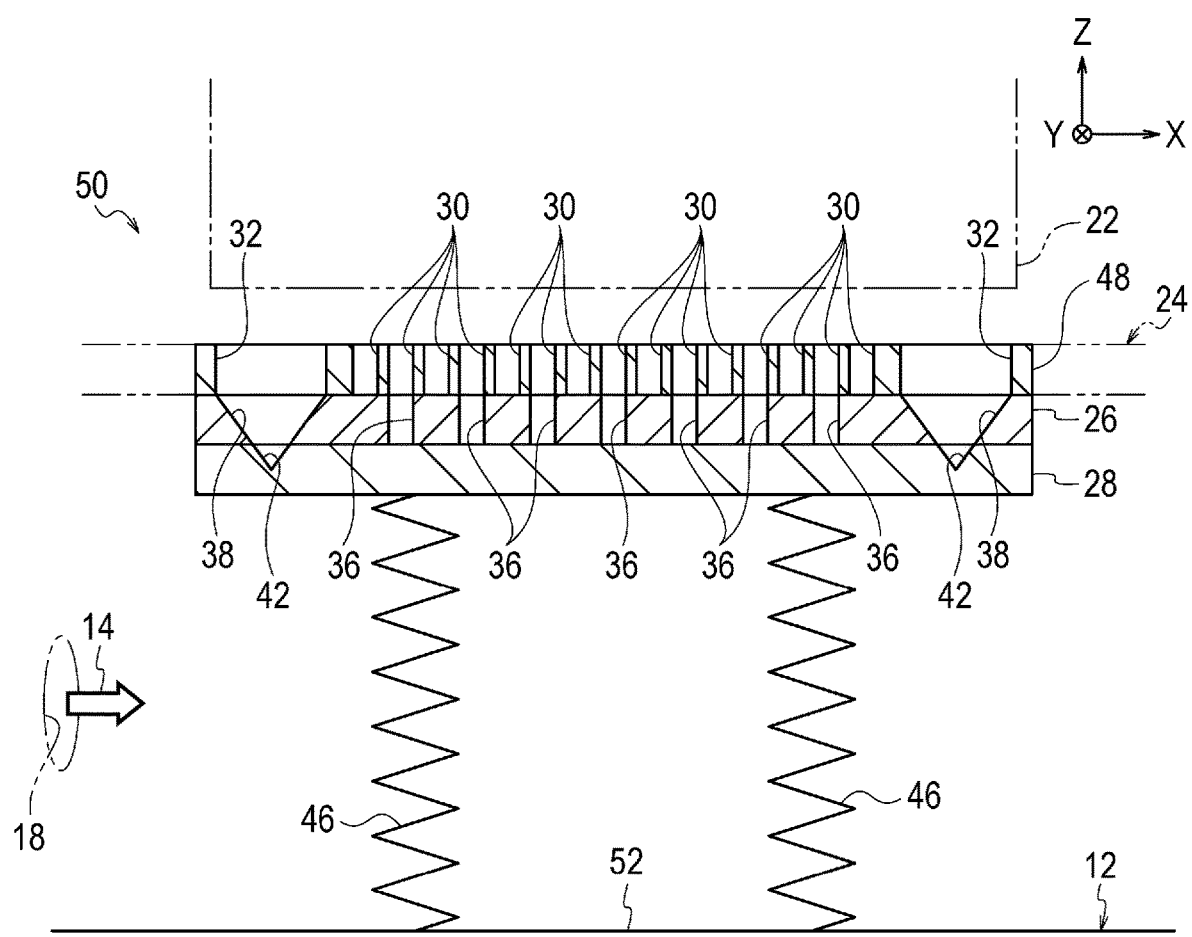
FIG. 4 is an enlarged longitudinal sectional view of the straightening plate, the flow adjusting plate, and the open/close plate illustrated in FIG. 2 and a plurality of urging members.

FIG. 4 is an enlarged view of the straightening plate 24, the flow adjusting plate 26, and the open/close plate 28 illustrated in FIG. 2 and a plurality of urging members 46. FIG. 4 illustrates a portion of the straightening plate 24 overlapping the flow adjusting plate 26. Hereinafter, this portion of the straightening plate 24 overlapping the flow adjusting plate 26 is referred to as a straightening portion 48. The straightening plate 24 has a plurality of the straightening portions 48 that respectively overlap the flow adjusting plates 26. The straightening portion 48, the flow adjusting plate 26, the open/close plate 28, and the urging members 46 form a flow adjusting mechanism 50. A plurality of the flow adjusting mechanisms 50 are respectively provided for the slots 22. For example, the structures of the plurality of flow adjusting mechanisms 50 are the same.

As illustrated in FIG. 4, in each of the flow adjusting mechanisms 50, the total number of the flow adjusting holes 36 in the flow adjusting plate 26 is smaller than the number of the straightening holes 30 in the straightening portion 48. The flow adjusting holes 36 of the flow adjusting plate 26 are formed at positions aligned with the positions of some of the straightening holes 30 of the straightening portion 48. The remaining straightening holes 30 of the straightening portion 48 face, in the up-down direction, portions of the flow adjusting plate 26 other than the flow adjusting holes 36 or the first retaining holes 38.

In the up-down direction, the section of each of the straightening holes 30 is uniform and the section of each of the flow adjusting holes 36 is uniform. The flow adjusting holes 36 is the same as the straightening holes 30 in diameter. However, as described above, the total number of the flow adjusting holes 36 in the flow adjusting plate 26 is smaller than the number of the straightening holes 30 in the straightening portion 48. Accordingly, in each of the flow adjusting mechanisms 50, the total opening area of the flow adjusting holes 36 in the flow adjusting plate 26 is smaller than the total opening area of the straightening holes 30 in the straightening portion 48. For example, in a region where the straightening plate 24 overlaps the flow adjusting plate 26, the total opening area of the flow adjusting holes 36 is smaller than the total opening area of the straightening holes 30.

As described above, no flow adjusting hole is formed in the open/close plate 28. Accordingly, the flow adjusting holes 36 of the flow adjusting plate 26 face portions of the open/close plates 28 respectively aligned with the flow adjusting holes 36 in the up-down direction.

The first retaining holes 38 of the flow adjusting plate 26 are formed at positions respectively aligned with the positions the through holes 32 of the straightening portion 48. Whereas the section of the through holes 32 is uniform in the up-down direction, the first retaining holes 38 are tapered such that the diameter of the first retaining holes 38 reduces toward the bottom of the first retaining holes 38. Although upper end openings of the first retaining holes 38 is the same as lower end openings of the through holes 32 in diameter, lower end openings of the first retaining holes 38 is smaller than the lower end openings of the through holes 32 in diameter. This exemplifies a structure in which "the first retaining hole is smaller than the through hole in diameter".

The second retaining holes 42 of the open/close plates 28 are formed at positions respectively aligned with the positions the first retaining holes 38 of the flow adjusting plate 26. The second retaining holes 42 are tapered such that the diameter of the second retaining holes 42 reduces toward the bottom of the second retaining holes 42. Although upper end openings of the second retaining holes 42 is the same as lower end openings of the first retaining holes 38 in diameter, the upper end openings of the second retaining holes 42 is smaller than upper end openings of the first retaining holes 38 in diameter. This exemplifies a structure in which "the second retaining hole is smaller than the first retaining hole in diameter".

The straightening plate 24 having the straightening portions 48 illustrated in FIG. 4 is secured to the side walls 16 of the main tank 12 as illustrated in FIG. 2. The straightening plate 24 is secured in the up-down direction by being secured to the side walls 16. Meanwhile, the flow adjusting plates 26 and the open/close plates 28 are not secured to the side walls 16 and are independently movable in the up-down direction.

As illustrated in FIG. 4, in each of the flow adjusting mechanisms 50, the urging members 46 are provided between the open/close plates 28 and a bottom wall 52 of the main tank 12. As an example, the urging members 46 are coil springs disposed such that the axial direction of the coil springs is the up-down direction. The open/close plate 28 has, as described above, a rectangular shape in plan view. The urging members 46 are each disposed at a corresponding one of four corners of the open/close plate 28.

The open/close plate 28 is urged upward by the urging members 46, thereby the open/close plate 28 disposed below the flow adjusting plate 26 is overlapped by the flow adjusting plate 26. Furthermore, the flow adjusting plate 26 is pushed upward by the open/close plate 28, thereby the flow adjusting plate 26 disposed below the straightening portion 48 of the straightening plate 24 is overlapped by the straightening portion 48.

Figure 5:
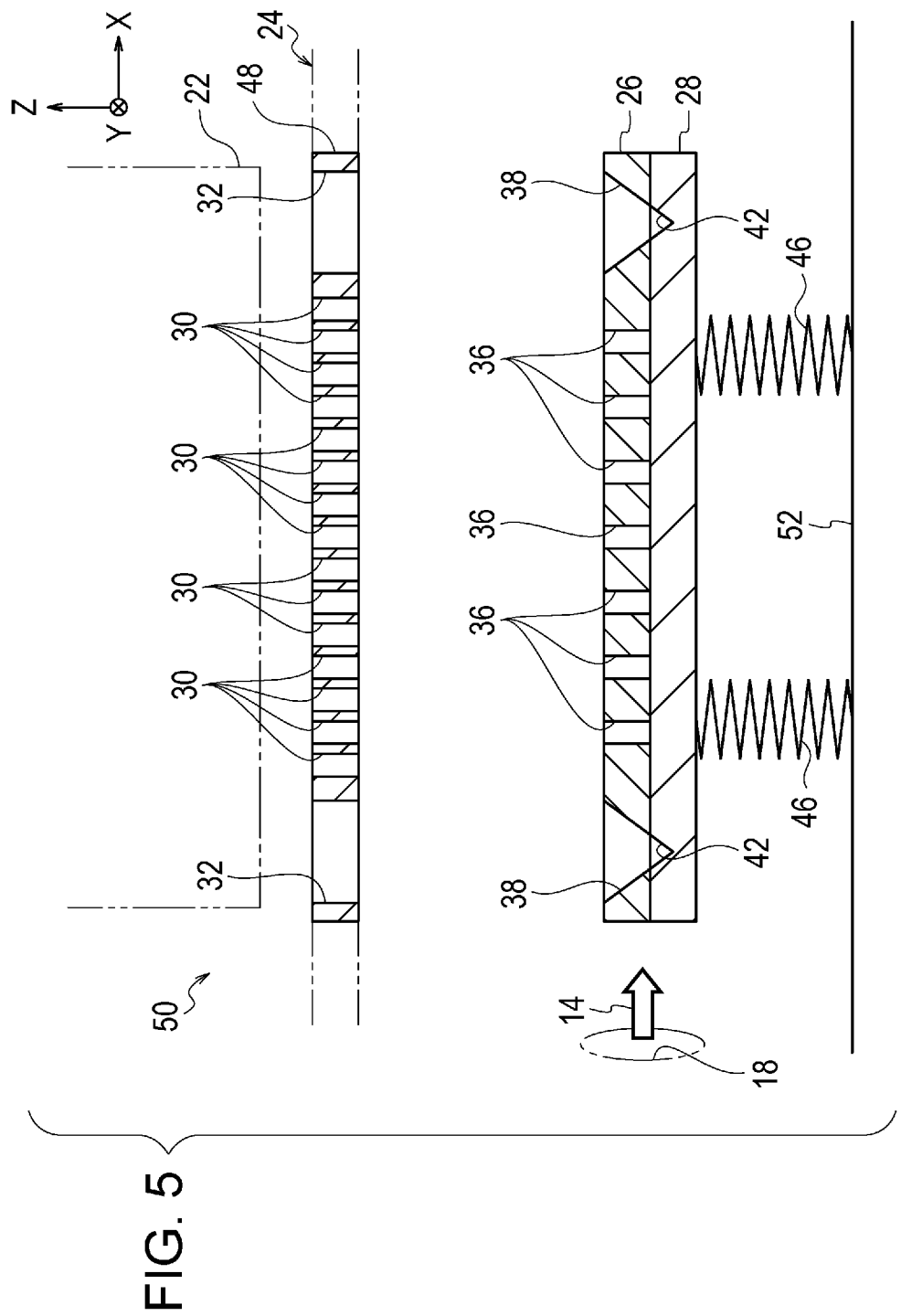
FIG. 5 is a longitudinal sectional view of a state in which the flow adjusting plate and the open/close plate illustrated in FIG. 4 have been pushed downward so as to be moved downward.
Figure 6:
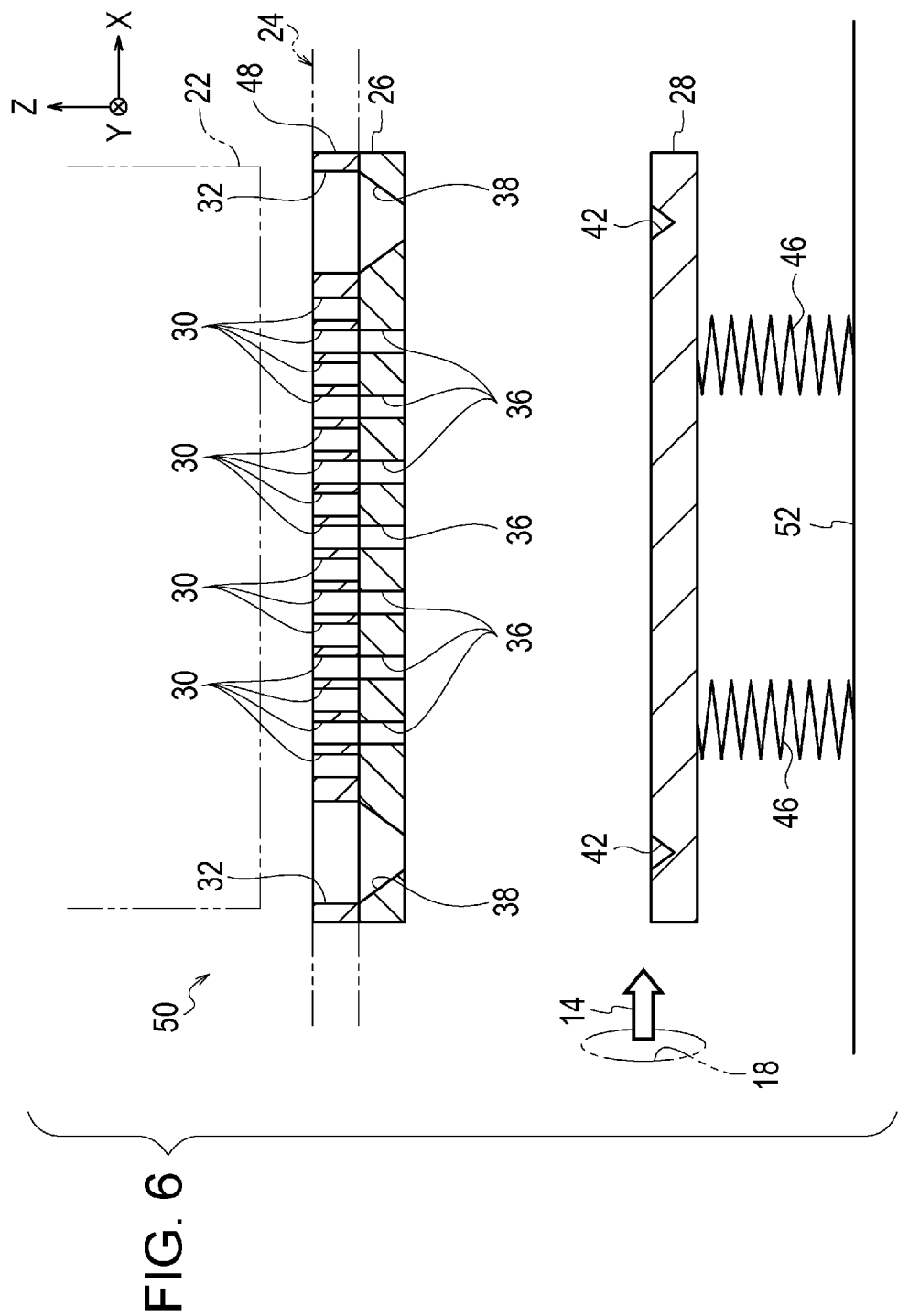
FIG. 6 is a longitudinal sectional view of a state in which the open/close plate illustrated in FIG. 4 has been pushed downward so as to be moved downward.

The flow adjusting plate 26 and the open/close plate 28 are, as described above, independently movable in the up-down direction. FIG. 5 illustrates a state in which the flow adjusting plate 26 and the open/close plate 28 illustrated in FIG. 4 have been pushed downward so as to be moved downward. FIG. 6 illustrates a state in which the open/close plate 28 illustrated in FIG. 4 has been pushed downward so as to be moved downward.

As illustrated in FIG. 4 (also see FIG. 6) and FIG. 5, the flow adjusting plate 26 is movable from an overlap position to a spaced position. At the overlap position, the flow adjusting plate 26 disposed below the straightening portion 48 is overlapped by the straightening portion 48. At the spaced position, the flow adjusting plate 26 disposed below the straightening portion 48 is spaced from the straightening portion 48. For example, FIG. 4 (also see FIG. 6) illustrates a state in which the flow adjusting plate 26 is at the overlap position where the flow adjusting plate 26 disposed below the straightening portion 48 is overlapped by the straightening portion 48. FIG. 5 illustrates a state in which the flow adjusting plate 26 is at the spaced position where the flow adjusting plate 26 disposed below the straightening portion 48 is spaced from the straightening portion 48.

Furthermore, as illustrated in FIGS. 4 and 6, the open/close plate 28 is movable from a closed position to an open position. At the closed position, the open/close plate 28 disposed below the flow adjusting plate 26 is overlapped by the flow adjusting plate 26 so as to close the flow adjusting holes 36. At the open position, the open/close plate 28 disposed below the flow adjusting plate 26 is spaced from the flow adjusting plate 26, thereby opening the flow adjusting holes 36. For example, FIG. 4 illustrates a state in which the open/close plate 28 is at the closed position where the open/close plate 28 disposed below the flow adjusting plate 26 is overlapped by the flow adjusting plate 26 so as to close the flow adjusting holes 36. Furthermore, FIG. 6 illustrates a state in which the open/close plate 28 is at the open position where the open/close plate 28 disposed below the flow adjusting plate 26 is spaced from the flow adjusting plate 26, thereby opening the flow adjusting holes 36.

As illustrated in FIGS. 5 and 6, the flow adjusting plate 26 and the open/close plate 28 are movable to positions below the coolant inflow port 18. The flow adjusting plate 26 is formed of a material having a lower density than that of the coolant 14. Thus, as illustrated in FIG. 6, even when the open/close plate 28 is disposed at the open position, the flow adjusting plate 26 disposed below the straightening plate 24 is overlapped by the straightening plate 24 due to application of pressure of the coolant 14 flowing from the coolant inflow port 18.

Next, the structures of electronic units 60 received in the slots 22 of the liquid immersion tank 10 are described in detail.

Figure 7A:
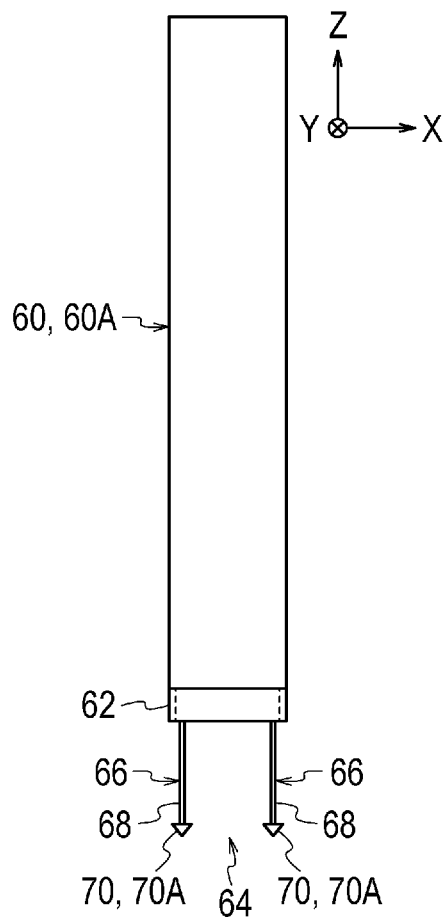
FIGS. 7A and 7B are comparative views of two types of electronic units used in the present embodiment.
Figure 7B:
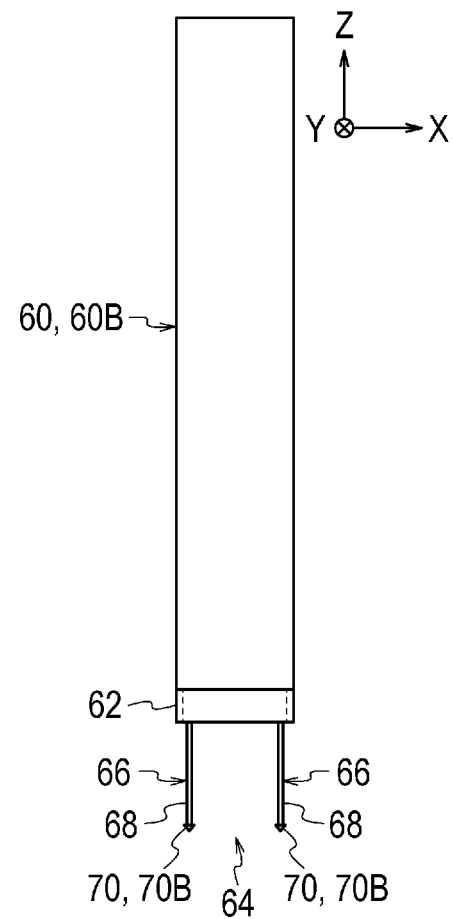

FIGS. 7A and 7B are comparative views of two types of electronic units 60 used in the present embodiment. As illustrated in FIGS. 7A and 7B, the two types of the electronic units 60 are used as examples according to the present embodiment. One of the electronic units 60 illustrated in FIG. 7A is a high-packing density electronic unit which generates a large amount of heat and with which a large amount of pressure is lost. The other electronic unit 60 illustrated in FIG. 7B is a low-packing density electronic unit which generates a small amount of heat and with which a small amount of pressure is lost.

As illustrated in FIGS. 7A and 7B, each of the electronic units 60 includes a duct 62 at a bottom surface portion thereof. The duct 62 has an annular shape having a space penetrating therethrough in the up-down direction. Each of the electronic units 60 also includes a push-down portion 64. Each of the push-down portions 64 includes a plurality of push-down members 66. The push-down members 66 are provided, for example, respective corners of the bottom surface portion of the electronic unit 60.

Each of the push-down members 66 includes a rod 68 and a retaining projection 70. The rod 68 extends downward from the bottom surface portion of the electronic unit 60. The retaining projection 70 is formed at a lower end portion of the rod 68. The retaining projection 70 is tapered (inverted cone-shaped) such that the diameter of the retaining projection 70 reduces toward the bottom of the retaining projection 70. An upper end of the retaining projection 70 (portion of the retaining projection 70 where the diameter of the retaining projection 70 is largest) is larger than the rod 68 in diameter. The diameter (top end diameter) of the retaining projection 70 provided in the electronic unit 60 illustrated in FIG. 7A is larger than the diameter (top end diameter) of the retaining projection 70 provided in the electronic unit 60 illustrated in FIG. 7B.

Hereinafter, when the high-packing density electronic unit 60 illustrated in FIG. 7A and the low-packing density electronic unit 60 illustrated in FIG. 7B are distinguished from each other, the high-packing density electronic unit 60 is referred to as "electronic unit 60A" and the low-packing density electronic unit 60 is referred to as "electronic unit 60B". Furthermore, when the retaining projections 70 provided in the electronic unit 60A and the retaining projections 70 provided in the electronic unit 60B are distinguished from each other, the retaining projections 70 provided in the electronic unit 60A are referred to as "retaining projections 70A" and the retaining projections 70 provided in the electronic unit 60B are referred to as "retaining projections 70B".

Figure 8A:
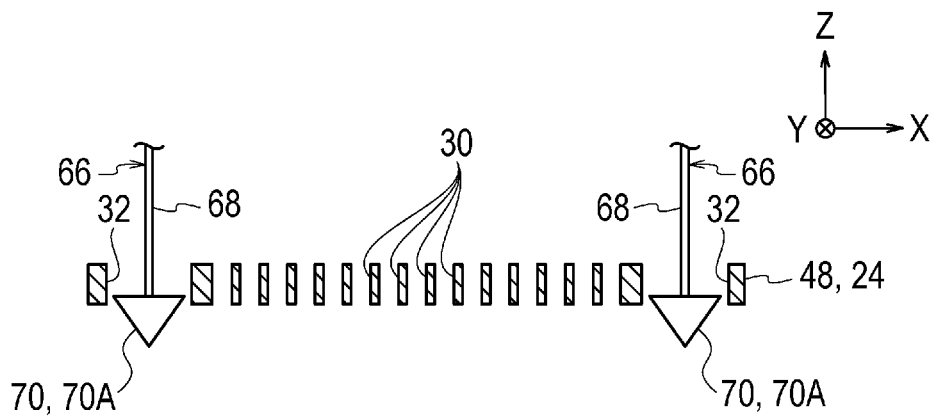
FIGS. 8A and 8B illustrate the relationships between through holes formed in the straightening portion illustrated in FIG. 4 and retaining projections illustrated in FIGS. 7A and 7B.
Figure 8B:
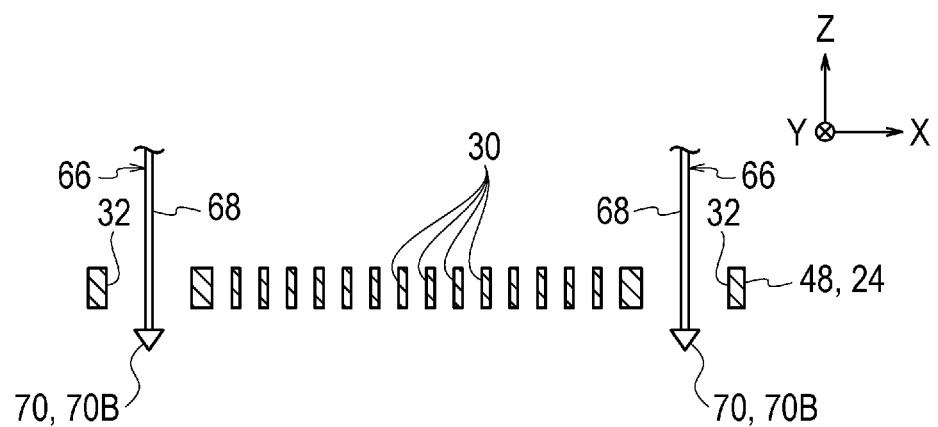

FIGS. 8A and 8B respectively illustrate the relationship between the retaining projections 70A illustrated in FIG. 7A and the through holes 32 formed in the straightening portion 48 illustrated in FIG. 4 and the relationship between the retaining projections 70B illustrated in FIG. 7B and the through holes 32. As illustrated in FIGS. 8A and 8B, the push-down members 66 including the retaining projections 70A and the push-down members 66 including the retaining projections 70B are respectively disposed at positions aligned with the through holes 32. The retaining projections 70A and the retaining projections 70B are smaller than the through holes 32 in diameter.

Figure 9A:
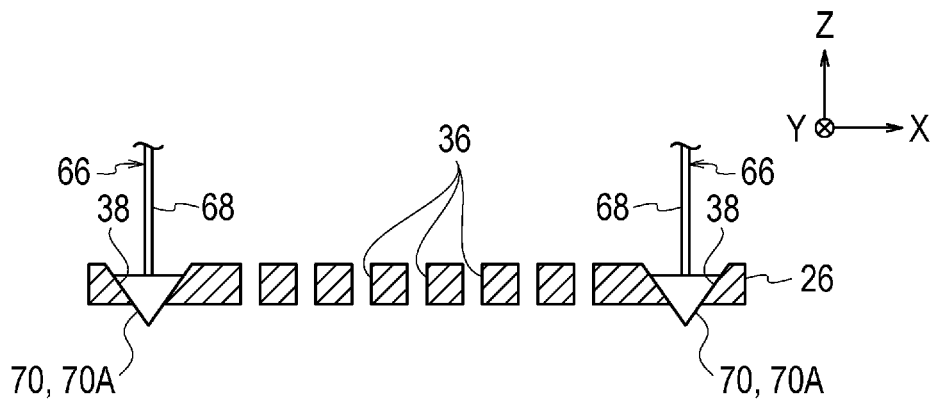
FIGS. 9A and 9B illustrate the relationships between first retaining holes formed in the flow adjusting plate illustrated in FIG. 4 and the retaining projections illustrated in FIGS. 7A and 7B.
Figure 9B:
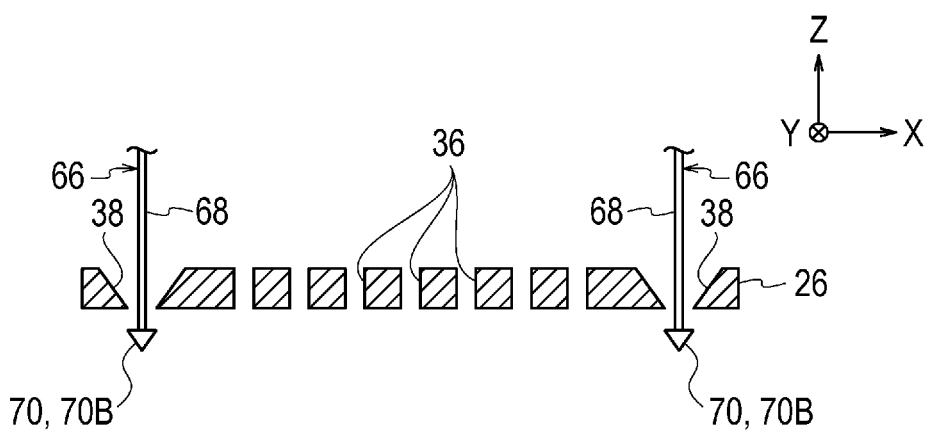

FIGS. 9A and 9B respectively illustrate the relationship between the retaining projections 70A illustrated in FIG. 7A and the first retaining holes 38 formed in the flow adjusting plate 26 illustrated in FIG. 4 and the relationship between the retaining projections 70B illustrated in FIG. 7B and the first retaining holes 38. As illustrated in FIGS. 9A and 9B, the push-down members 66 including the retaining projections 70A and the push-down members 66 including the retaining projections 70B are respectively disposed at positions aligned with the first retaining holes 38. The upper end of each of the retaining projections 70A (portion of the retaining projection 70A where the diameter of the retaining projection 70A is largest) is larger than a lower end opening of a corresponding one of the first retaining holes 38 in diameter, and the retaining projection 70A is able to be retained at the first retaining hole 38. The retaining projections 70B is smaller than the first retaining holes 38 in diameter. Thus, the retaining projections 70B are each able to pass through a corresponding one of the first retaining holes 38.

Figure 10A:
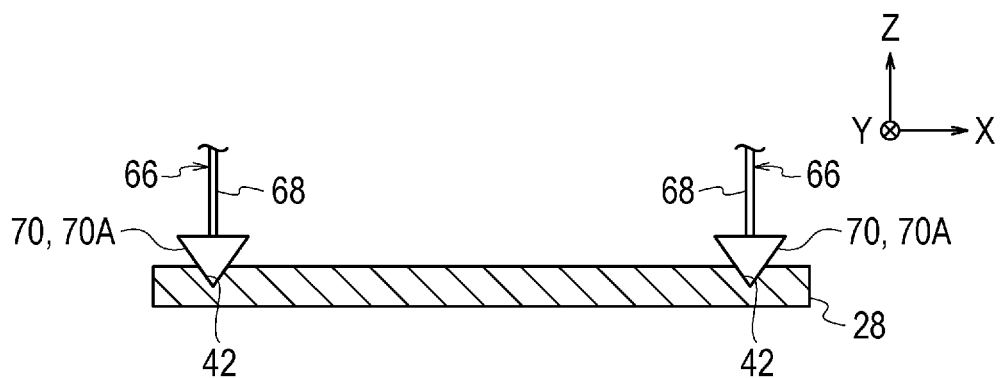
FIGS. 10A and 10B illustrate the relationships between second retaining holes formed in the open/close plate illustrated in FIG. 4 and the retaining projections illustrated in FIGS. 7A and 7B.
Figure 10B:
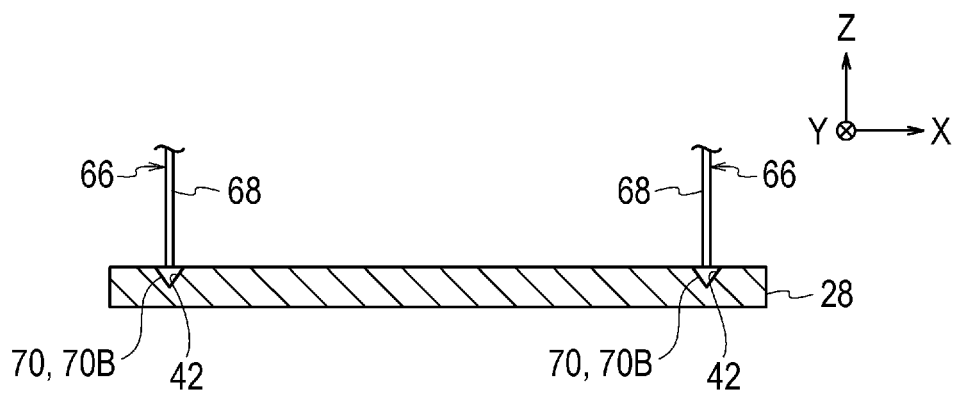

FIGS. 10A and 10B respectively illustrate the relationship between the retaining projections 70A illustrated in FIG. 7A and the second retaining holes 42 formed in the open/close plate 28 illustrated in FIG. 4 and the relationship between the retaining projections 70B illustrated in FIG. 7B and the second retaining holes 42. As illustrated in FIGS. 10A and 10B, the push-down members 66 including the retaining projections 70A and the push-down members 66 including the retaining projections 70B are respectively disposed at positions aligned with the second retaining holes 42. The retaining projections 70A and the retaining projections 70B have the respective shapes and sizes with which the retaining projections 70A and the retaining projections 70B are retained at the second retaining holes 42. Thus, the retaining projections 70A and the retaining projections 70B are able to be retained at the second retaining holes 42.

Next, operations and effects according to the present embodiment are described in addition to a method of using the liquid immersion tank 10.

Figure 11:
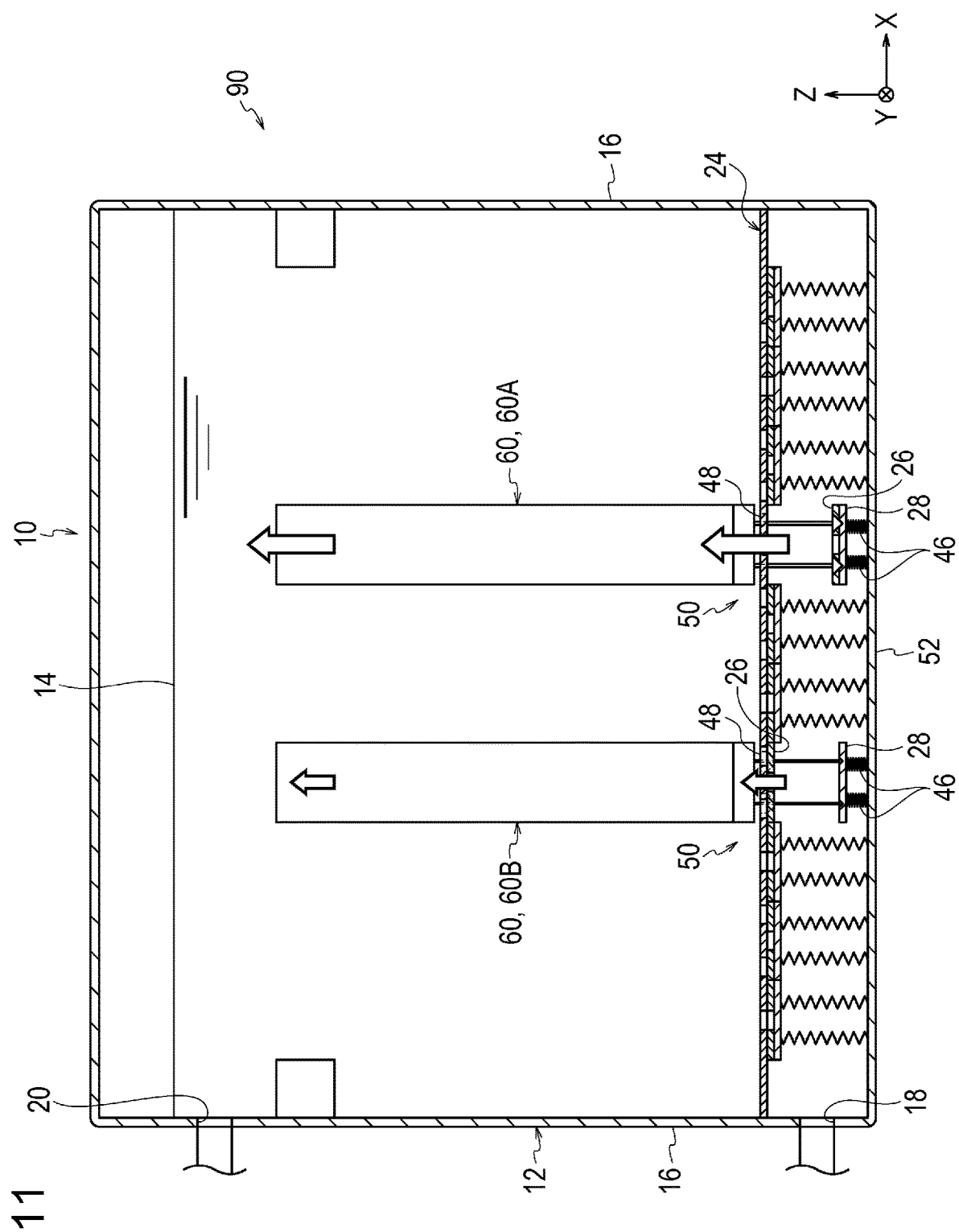
FIG. 11 is a longitudinal sectional view illustrating a state in which the two types of electronic units illustrated in FIGS. 7A and 7B are received in the liquid immersion tank illustrated in FIG. 2.

FIG. 11 illustrates a state in which the two types of electronic units 60A, 60B illustrated in FIGS. 7A and 7B are received in the liquid immersion tank 10 illustrated in FIG. 2. Referring to FIG. 11, as an example, only two electronic units 60 are received in the liquid immersion tank 10. However, the electronic units 60 are able to be independently received in the slots 22 (see FIG. 2) in the liquid immersion tank 10. The liquid immersion tank 10 and the electronic units 60 received in this liquid immersion tank 10 form an electronic apparatus 90.

Figure 12:
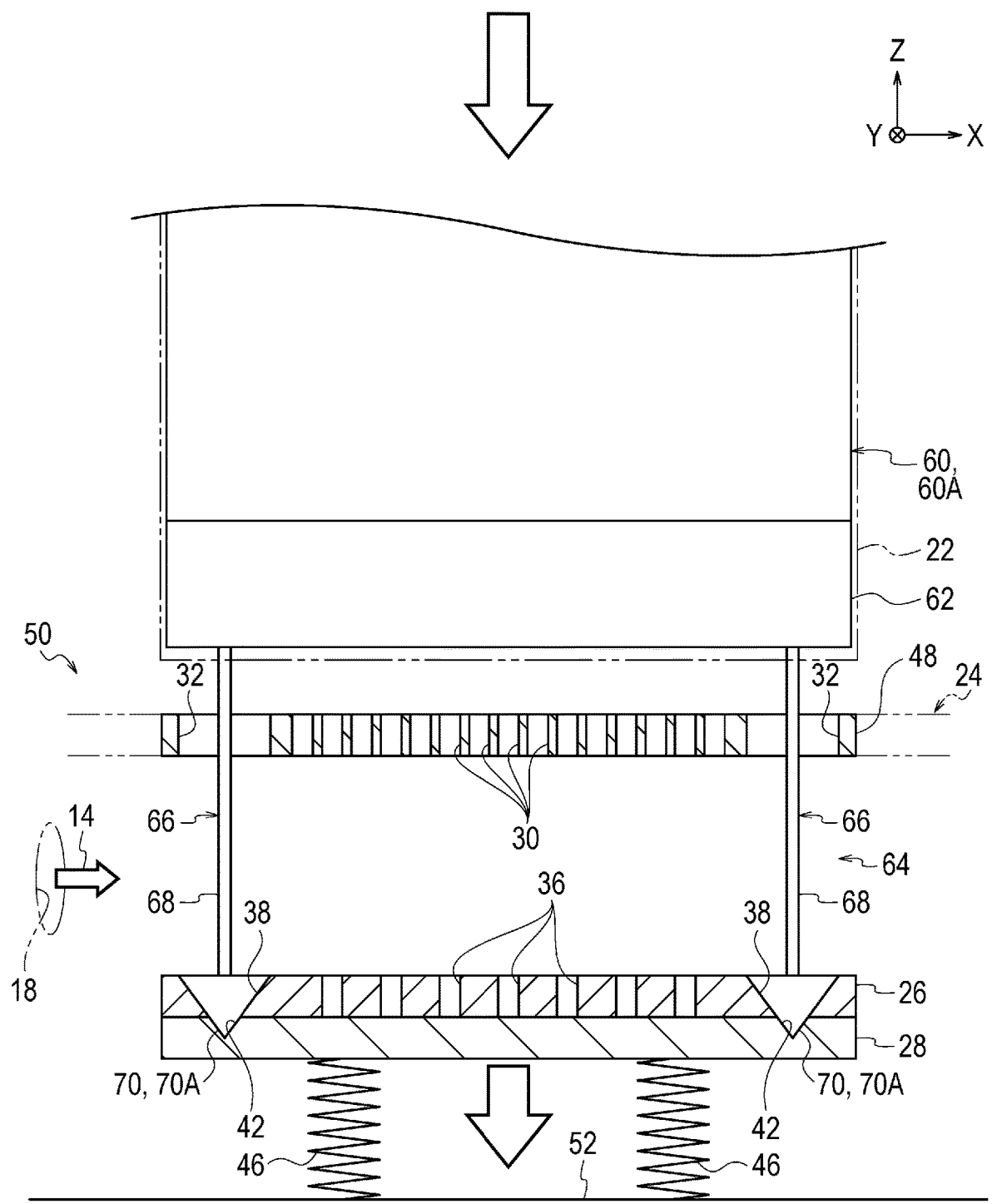
FIG. 12 is an enlarged longitudinal sectional view of a lower portion and a region around the lower portion of the high-packing density electronic unit illustrated in FIG. 11.

FIG. 12 is an enlarged view of a lower portion and a region around the lower portion of the high-packing density electronic unit 60A illustrated in FIG. 11. As illustrated in FIG. 12, as the electronic unit 60A is moved from above and received in one of the slots 22, the retaining projections 70A pass through the through holes 32 and are retained at the first retaining holes 38 and the second retaining holes 42. As the electronic unit 60A is moved downward, the flow adjusting plate 26 and the open/close plate 28 are pushed downward. Thus, the flow adjusting plate 26 is moved to the spaced position where the flow adjusting plate 26 disposed below the straightening portion 48 is spaced from the straightening portion 48. In this state, the coolant 14 having flowed in from the coolant inflow port 18 is supplied to the electronic unit 60A through the straightening holes 30.

Here, in each of the flow adjusting mechanism 50, the number of the straightening holes 30 is larger than the number of the flow adjusting holes 36. This increases the flow amount of the coolant 14 supplied to the electronic unit 60A. Thus, the high-packing density electronic unit 60A may be appropriately cooled.

Figure 13:
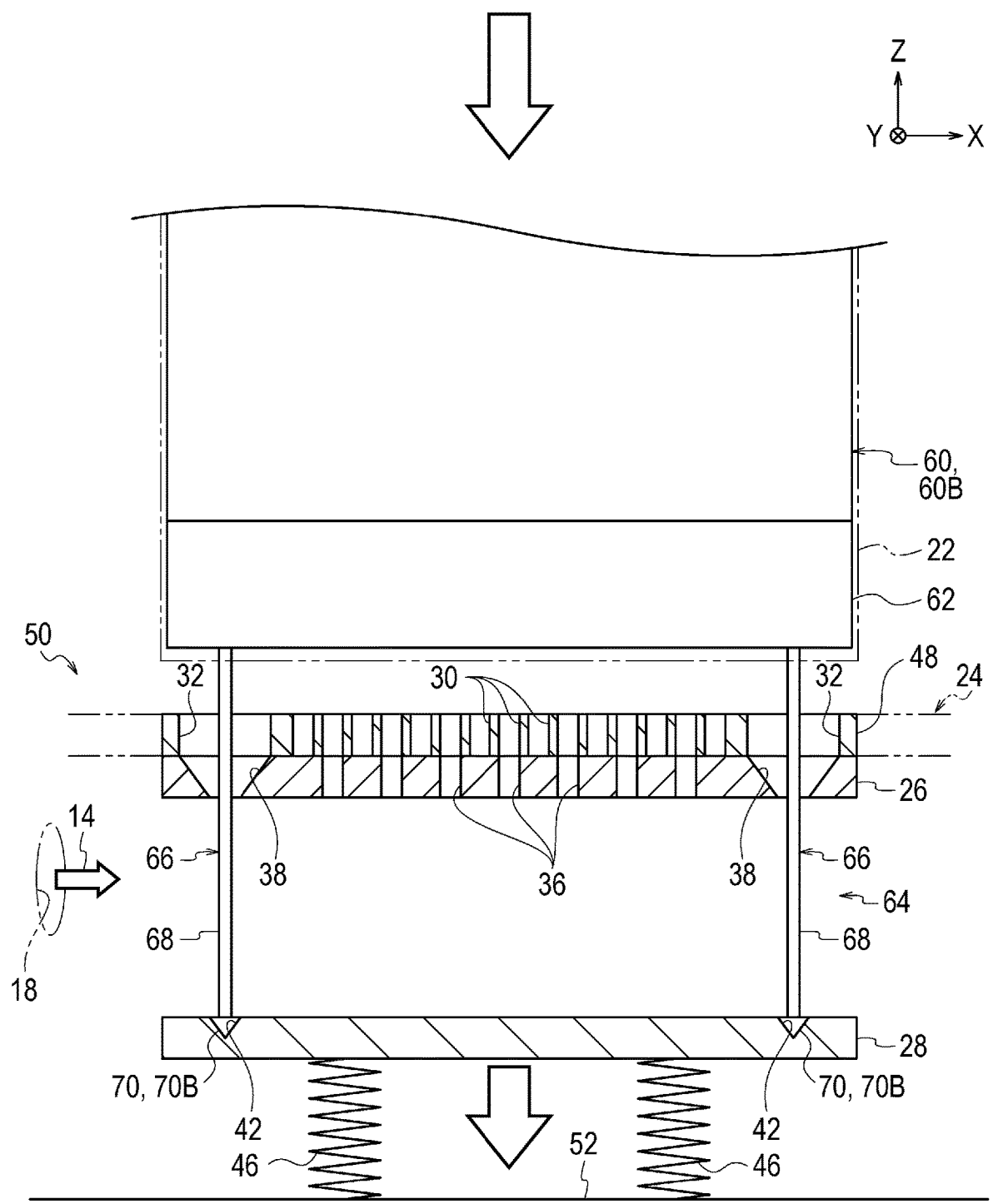
FIG. 13 is an enlarged longitudinal sectional view of a lower portion and a region around the lower portion of the low-packing density electronic unit illustrated in FIG. 11.

Meanwhile, FIG. 13 is an enlarged view of a lower portion and a region around the lower portion of the low-packing density electronic unit 60B illustrated in FIG. 11. As illustrated in FIG. 13, as the electronic unit 60B is moved from above and received in one of the slots 22, the retaining projections 70B pass through the through holes 32 and the first retaining holes 38 and are retained at the second retaining holes 42. As the electronic unit 60B is moved downward, the open/close plate 28 is pushed downward.

Thus, the open/close plate 28 is moved to the open position where the open/close plate 28 disposed below the flow adjusting plate 26 is spaced from the flow adjusting plate 26. In this state, the coolant 14 having flowed in from the coolant inflow port 18 is supplied to the electronic unit 60B through the flow adjusting holes 36.

Here, in each of the flow adjusting mechanism 50, the number of the flow adjusting holes 36 is smaller than the number of the straightening holes 30. This reduces the flow amount of the coolant 14 supplied to the electronic unit 60B. Thus, overcooling of the low-packing density electronic unit 60B may be suppressed.

As described above, according to the present embodiment, the flow amount of the coolant 14 supplied to the electronic units 60 is adjusted in accordance with the packing density of the electronic units 60. Accordingly, the electronic units 60 may be cooled with a flow amount of the coolant 14 appropriate for the electronic units 60.

Furthermore, the electronic units 60 each include the push-down members 66. As the electronic unit 60 is moved from above and received in the slot 22, the push-down members 66 push downward the flow adjusting plate 26 and the open/close plate 28 so as to move the flow adjusting plate 26 to the spaced position or push downward the open/close plate 28 so as to move the open/close plate 28 to the open position. Accordingly, when the electronic unit 60 is moved into the slot 22 so as to be received in the slot 22, the flow adjusting plate 26 or the open/close plate 28 is able to be selectively pushed down. This may improve convenience compared to the case where, for example, an operation for selectively pushing down the flow adjusting plate 26 or the open/close plate 28 is separately required in addition to an operation for receiving the electronic unit 60.

The high-packing density electronic unit 60A includes the push-down members 66 that push down the flow adjusting plate 26 and the low-packing density electronic unit 60B includes the push-down members 66 that push down the open/close plate 28. In this way, in accordance with the packing density of each of the electronic units 60, the electronic unit 60 is assigned, in advance, with the push-down members 66 that push down the flow adjusting plate 26 or the push-down members 66 that push down the open/close plate 28. Accordingly, since the flow adjusting plate 26 or the open/close plate 28 is able to be selectively pushed down in accordance with the packing density of each of the electronic unit 60, a flow amount appropriate for the packing density of the electronic unit 60 may be ensured.

The mechanism that selectively pushes down the flow adjusting plate 26 or the open/close plate 28 is a mechanical structure that has the push-down members 66, the through holes 32, the first retaining holes 38, and the second retaining holes 42. Accordingly, power consumption may be reduced compared to the case where, for example, an electrical structure that includes an electrical actuator or the like is used as the mechanism that selectively pushes down the flow adjusting plate 26 or the open/close plate 28. This may reduce the operating cost of the cooling system 100.

As illustrated in FIGS. 12 and 13, when the electronic unit 60 received in the slot 22 is removed from the slot 22, the open/close plate 28, together with the flow adjusting plate 26, is pushed upward by the urging members 46. Thus, the flow adjusting plate 26 disposed below the straightening portion 48 is overlapped by the straightening portion 48, and the open/close plate 28 disposed below the flow adjusting plate 26 is overlapped by the flow adjusting plate 26 (see FIG. 4). In this state, the flow adjusting holes 36 are closed by the open/close plate 28. Thus, supply of the coolant 14 to the slot 22 where no electronic unit 60 is received is stopped. Accordingly, it is sufficient that the circulation pump 102 be operated at a rotational speed at which the electronic units 60 received in the other slots 22 is able to be cooled. Thus, the rotational speed of the circulation pump 102 may be set to a lowest required speed. As a result, also with this feature, power consumption may be reduced, and accordingly, the operating cost of the cooling system 100 may be reduced. Furthermore, since the coolant 14 may be efficiently supplied to the other slots 22, cooling performance for the electronic units 60 received in the other slots 22 may be improved.

Furthermore, the urging members 46 that urge the open/close plate 28 upward are used. Accordingly, when the electronic unit 60 is removed from the slot 22, the open/close plate 28 and the flow adjusting plate 26 are able to be returned to their original positions by a pushing up force of the urging members 46. Thus, an operation for moving the open/close plate 28 and the flow adjusting plate 26 upward is not required. Accordingly, also with this feature, convenience may be improved.

Next, variations of the present embodiment are described.

Figure 14:
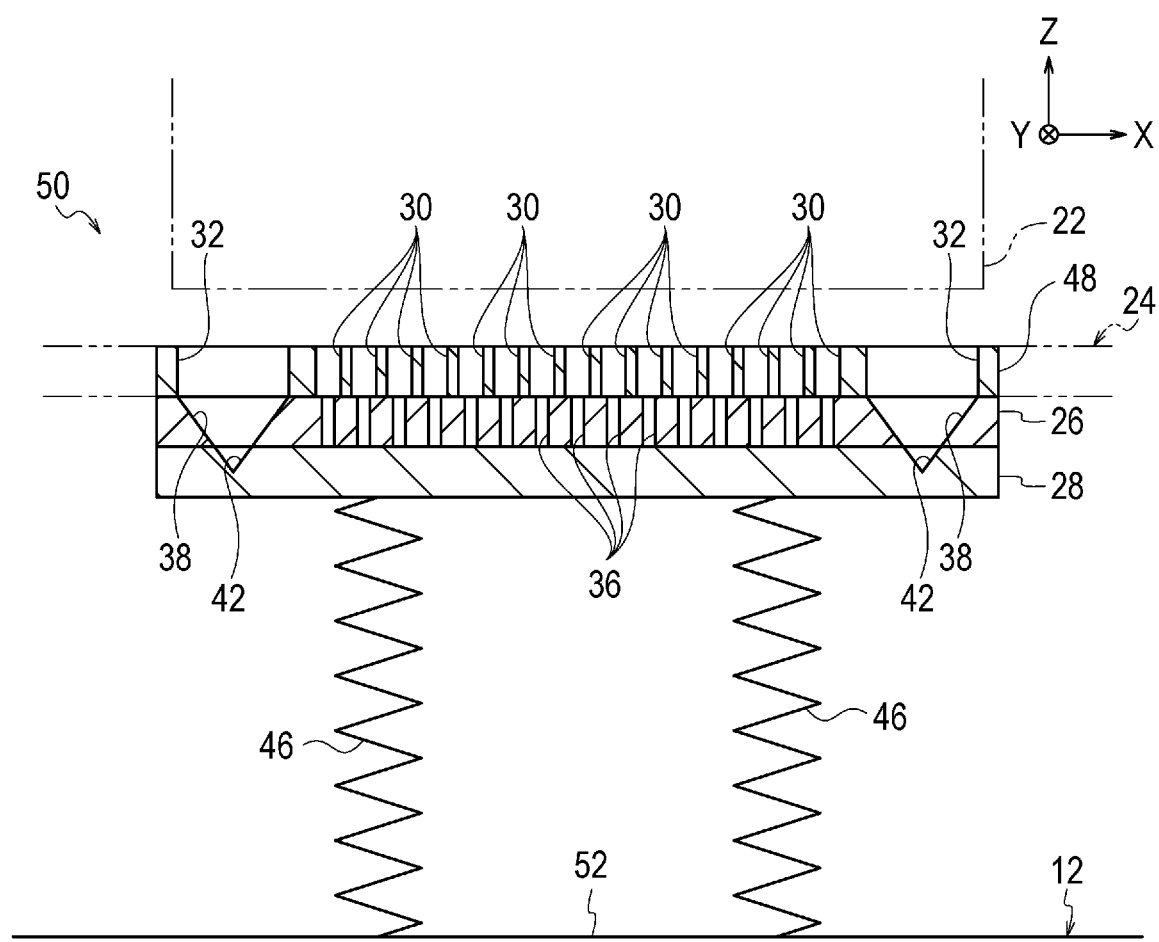
FIG. 14 is a longitudinal sectional view of a variation of the relationship between a plurality of straightening holes and a plurality of flow adjusting holes illustrated in FIG. 4.

According to the above-described embodiment, in each of the flow adjusting mechanism 50, the number of the flow adjusting holes 36 is smaller than the number of the straightening holes 30. Thus, in each of the flow adjusting mechanism 50, the total opening area of the flow adjusting holes 36 is smaller than the total opening area of the straightening holes 30. However, as illustrated in FIG. 14, the flow adjusting holes 36 may be smaller than the straightening holes 30 in diameter. In each of the flow adjusting mechanism 50, the total opening area of the flow adjusting holes 36 may be smaller than the total opening area of the straightening holes 30. In this case, the number of the flow adjusting holes 36 may be the same as or smaller than the number of the straightening holes 30.

Furthermore, although the section of the through holes 32 is uniform in the up-down direction according to the above-described embodiment, the through holes 32 may be tapered such that the diameter of the through holes 32 reduces toward the bottom of the through holes 32. Furthermore, although the first retaining holes 38 are tapered such that the diameter of the first retaining holes 38 reduces toward the bottom of the first retaining holes 38, the section of the first retaining holes 38 may be uniform in the up-down direction. Likewise, although the second retaining holes 42 are tapered such that the diameter of the second retaining holes 42 reduces toward the bottom of the second retaining holes 42, the section of the second retaining holes 42 may be uniform in the up-down direction. In such a structure in which the section of the through holes 32 is uniform in the up-down direction, the section of the first retaining holes 38 is uniform in the up-down direction, and the section of the second retaining holes 42 is uniform in the up-down direction, the first retaining holes 38 may be smaller than the through holes 32 in diameter and the second retaining holes 42 may be smaller than the first retaining holes 38 in diameter.

Furthermore, although the section of the straightening holes 30 is uniform in the up-down direction according to the above-described embodiment, the straightening holes 30 may be tapered such that the diameter of the straightening holes 30 reduces toward the top or bottom of the straightening holes 30. Likewise, although the section of the flow adjusting holes 36 is uniform in the up-down direction, the flow adjusting holes 36 may be tapered such that the diameter of the flow adjusting holes 36 reduces toward the top or bottom of the flow adjusting holes 36.

Furthermore, although the liquid immersion tank 10 includes a single layer of the flow adjusting plates 26 according to the above-described embodiment, the liquid immersion tank 10 may include a plurality of layers of the flow adjusting plates 26 overlapping one on top of another in the up-down direction. In this case, the first retaining holes 38 of the flow adjusting plates 26 of a lower layer may be smaller, in diameter, than the first retaining holes 38 of the flow adjusting plates 26 of the upper layer. With such a structure, the flow amount of the coolant 14 supplied to the electronic units 60 may be more finely adjusted in accordance with the packing density (heat generation amount) of the electronic units 60.

Although, for each of the slots 22, a corresponding one of the flow adjusting mechanisms 50 is provided in the liquid immersion tank 10 according to the above-described embodiment, a plurality of the flow adjusting mechanisms 50 may be provided for each of the slots 22.

Although the liquid immersion tank 10 includes a plurality of the slots 22 according to the above-described embodiment, the liquid immersion tank 10 may include only a single slot 22.

Figure 15:
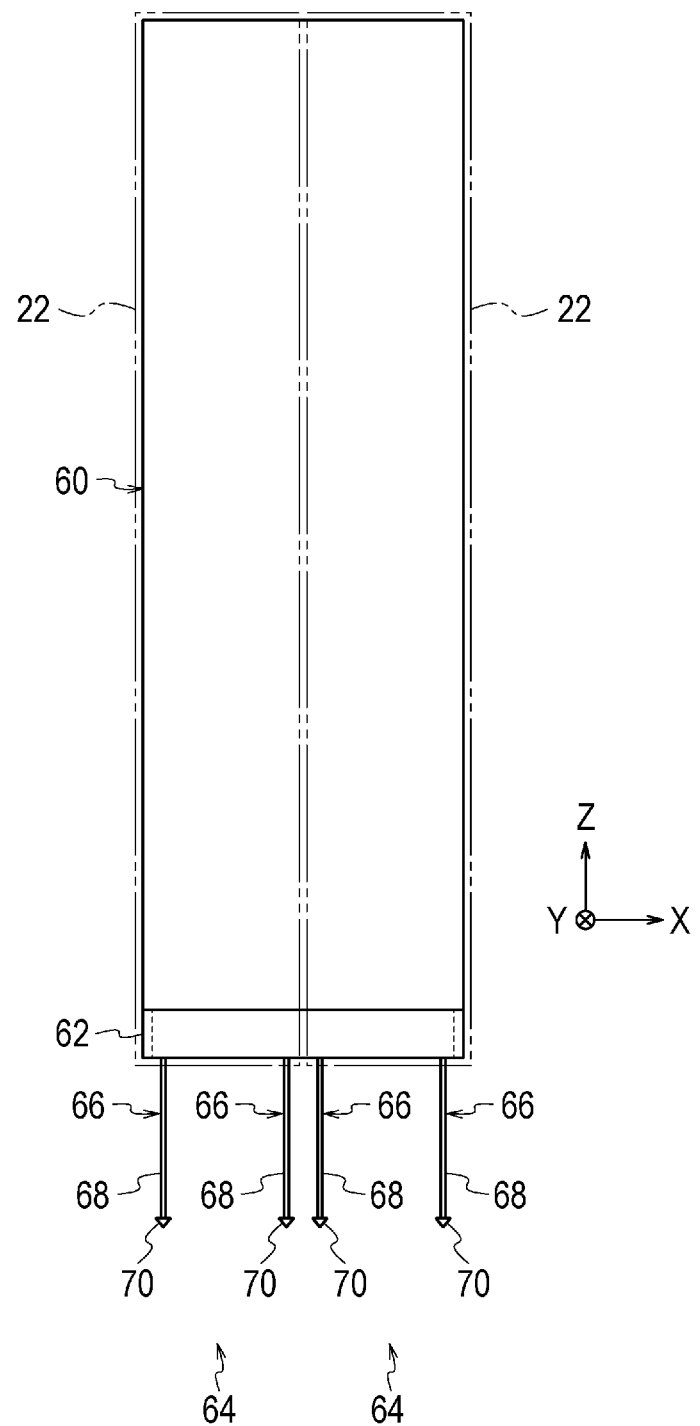
FIG. 15 is a front view of a first variation of the electronic unit illustrated in FIGS. 7A and 7B.
Figure 16:
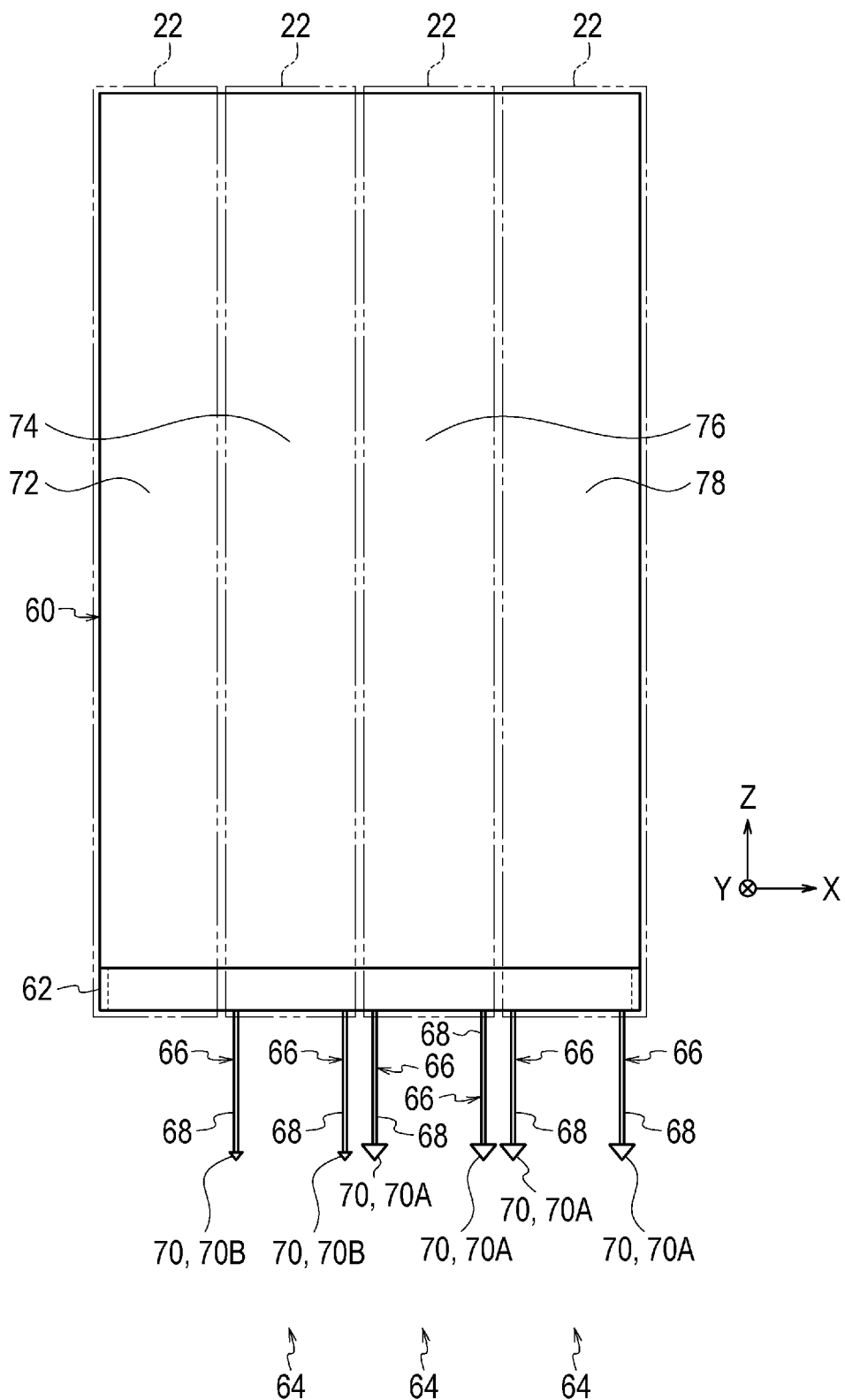
FIG. 16 is a front view of a second variation of the electronic unit illustrated in FIGS. 7A and 7B.

Furthermore, according to the above-described embodiment, each of the electronic units 60 is made to have a size with which the electronic unit 60 is received in a single slot 22. Alternatively, for example, the electronic unit 60 may be made to have a size with which the electronic unit 60 is received in two slots 22 as illustrated in FIG. 15. Alternatively, the electronic unit 60 may be made to have a size with which the electronic unit 60 is received in four slots 22 as illustrated in FIG. 16. Thus, the electronic unit 60 may be made to have a size with which the electronic unit 60 is received in a plurality of the slots 22.

Furthermore, as illustrated in FIG. 15, the electronic unit 60 may be provided with a plurality of the push-down portions 64. With such a structure, each of the push-down portions 64 is able to be selectively push down the flow adjusting plate 26 or the open/close plate 28 (see FIGS. 12 and 13). Thus, the coolant may be supplied to the entirety of the electronic unit 60 received in a plurality of the slots 22.

Furthermore, as illustrated in FIG. 16, the electronic unit 60 may have a structure in which the push-down portion 64 is not provided below a low-packing density portion 72 of the electronic unit 60 and the push-down portions 64 are provided below high-packing density portions 74, 76, 78 of the electronic unit 60. With such a structure, the coolant is able to be supplied to the high-packing density portions 74, 76, 78 and supply of the coolant to the low-packing density portion 72 is suppressed. Thus, the high-packing density portions 74, 76, 78 may be efficiently cooled.

Furthermore, as illustrated in FIG. 16, when the heat generation amounts of the high-packing density portions 74, 76, 78 are different from one another, for example, the push-down portion 64 including the retaining projections 70B may be provided below the high-packing density portion 74 generating a small amount of heat, and the push-down portions 64 including the retaining projections 70A may be provided below the high-packing density portions 76, 78 generating a large amount of heat. With such a structure, the high-packing density portions 74, 76, 78 may be appropriately cooled with the coolant the flow amounts of which are appropriate for the heat generation amounts of the high-packing density portions 74, 76, 78.

According to the above-described embodiment, the electronic unit 60 includes the push-down portion 64 (the push-down members 66), and the liquid immersion tank 10 has the through holes 32, the first retaining holes 38, and the second retaining holes 42 as structures corresponding to the push-down portion 64. However, the push-down portion 64, the through holes 32, the first retaining holes 38, and the second retaining holes 42 may be omitted. In this case, a mechanism that selectively pushes down the flow adjusting plate 26 or the open/close plate 28 (see FIGS. 12 and 13) in accordance with the electronic unit 60 may be separately provided so as to manually performing the operation for selectively pushing down the flow adjusting plate 26 or the open/close plate 28 in accordance with the electronic unit 60.

Out of a plurality of the above-described variations, the variations that are able to be combined with each other may be appropriately combined.

Although the embodiment of the technique disclosed herein has been described, the technique disclosed herein is not limited to the above description. Of course, in addition to the above description, the technique disclosed herein is able to be varied in a variety of manners and embodied without departing from the gist thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A liquid immersion tank comprising:
   a first tank configured to store coolant to cool an electronic device provided in the first tank;
   a first plate horizontally disposed below the electronic device and configured to include a plurality of straightening holes that penetrate through the first plate in a vertical direction; and
   a second plate disposed below the first plate and configured to be movable from an overlap position overlapped by the first plate to a spaced position where the second plate is disposed below the first plate and spaced from the first plate, the second plate including a plurality of flow adjusting holes that are formed at positions respectively aligned with the plurality of straightening holes and that penetrate through the second plate in the vertical direction,
   wherein, in a region where the first plate overlaps the second plate, a total opening area of the plurality of flow adjusting holes is smaller than a total opening area of the plurality of straightening holes.

2. The liquid immersion tank according to claim 1,
   wherein, in the region where the first plate overlaps the second plate, a number of the plurality of flow adjusting holes is smaller than a number of the plurality of straightening holes.

3. The liquid immersion tank according to claim 1,
   wherein the plurality of flow adjusting holes are smaller than the plurality of straightening holes in diameter.

4. The liquid immersion tank according to claim 1, further comprising:
   a third plate disposed below the second plate and configured to be movable from a closed position where the third plate is overlapped by the second plate so as to close the plurality of flow adjusting holes to an open position where the third plate is spaced from the second plate so as to open the plurality of flow adjusting holes.

5. The liquid immersion tank according to claim 4,
wherein the first plate is configured to include a through hole that penetrates through the first plate in the vertical direction,
wherein the second plate is configured to include a first retaining hole that is formed at a position aligned with the through hole and that penetrates through the second plate in the vertical direction, the first retaining hole being smaller than the through hole in diameter, and
wherein the third plate is configured to include a second retaining hole formed at a position aligned with the first retaining hole, the second retaining hole being smaller than the first retaining hole in diameter.

6. The liquid immersion tank according to claim 4, further comprising:
a spring configured to urge the third plate upward.

7. The liquid immersion tank according to claim 1,
wherein the second plate is lower than the coolant in density.

8. The liquid immersion tank according to claim 1,
wherein a coolant inflow port through which the coolant flows into the first tank is formed in the first tank, and
wherein the first plate is located above the coolant inflow port.

9. The liquid immersion tank according to claim 1,
wherein the second plate includes a plurality of second plates, and
wherein the plurality of second plates are disposed below the first plate and overlapped by the first plate.

10. An electronic apparatus comprising:
an electronic device; and
a liquid immersion tank configured to include,
a first tank configured to store coolant to cool the electronic device provided in the first tank;
a first plate horizontally disposed below the electronic device and configured to include a plurality of straightening holes that penetrate through the first plate in a vertical direction; and
a second plate disposed below the first plate and configured to be movable from an overlap position overlapped by the first plate to a spaced position where the second plate is disposed below the first plate and spaced from the first plate, the second plate including a plurality of flow adjusting holes that are formed at positions respectively aligned with the plurality of straightening holes and that penetrate through the second plate in the vertical direction,
wherein, in a region where the first plate overlaps the second plate, a total opening area of the plurality of flow adjusting holes is smaller than a total opening area of the plurality of straightening holes.

11. The electronic apparatus according to claim 10,
wherein the liquid immersion tank is configured to further include
a third plate disposed below the second plate and configured to be movable from a closed position where the third plate is overlapped by the second plate so as to close the plurality of flow adjusting holes to an open position where the third plate is spaced from the second plate so as to open the plurality of flow adjusting holes, and
wherein a push-down member configured to push downward the second plate and the third plate so as to move the second plate to the spaced position or push downward the third plate so as to move the third plate to the open position is installed to the electronic device when the electronic device is provided in the first tank.

12. The electronic apparatus according to claim 11,
wherein the first plate is configured to include a through hole that penetrates through the first plate in the vertical direction,
wherein the second plate is configured to include a first retaining hole that is formed at a position aligned with the through hole and that penetrates through the second plate in the vertical direction, the first retaining hole being smaller than the through hole in diameter,
wherein the third plate is configured to include a second retaining hole formed at a position aligned with the first retaining hole, the second retaining hole being smaller than the first retaining hole in diameter, and
wherein the push-down member includes a retaining projection configured to be retained at the first retaining hole or pass through the first retaining hole and be retained at the second retaining hole.

\* \* \* \* \*